United States Patent [19]
Naritake et al.

[11] Patent Number: 5,400,291
[45] Date of Patent: Mar. 21, 1995

[54] DYNAMIC RAM

[75] Inventors: Isao Naritake; Tadahiko Sugibayashi, both of Tokyo, Japan

[73] Assignee: NEC Corporation, Tokyo, Japan

[21] Appl. No.: 133,868

[22] Filed: Oct. 12, 1993

[30] Foreign Application Priority Data

Oct. 12, 1992 [JP] Japan .................. 4-273247

[51] Int. Cl.[6] ............................. G11C 13/00
[52] U.S. Cl. ...................... 365/230.01; 365/189.01
[58] Field of Search ............... 365/226, 227, 189.01, 365/230.01, 185

[56] References Cited

U.S. PATENT DOCUMENTS 3,660,819  5/1972  Freitman-Bautchkowsky ... 365/185

OTHER PUBLICATIONS

S. Sakuma et al., "A Study of Shared-Sense-Amp . . . for DRAM", Paper, pp. 5-248, Spring Conf. of the Institute of Electronics, Information and Communication Engineers of Japan, Mar. 24-27, 1992.

Primary Examiner—Terrell W. Fears
Attorney, Agent, or Firm—Sughrue, Mion, Zinn, Macpeak & Seas

[57] ABSTRACT

A dynamic RAM comprises first and second memory cell arrays respectively outputting holding data to corresponding bit lines when selected, sense amplifier means having amplifying MOS transistor for amplifying output of the bit lines of the first and second memory cell arrays, first and second transfer gate means respectively providing corresponding to the first and second memory cell arrays and controlling establishing and blocking connection between corresponding memory cell array and the sense amplifier means, first and second driver means respective provided corresponding to the first and second transfer gate means and generating gate control voltages for corresponding transfer gate means. Each of the first and second driver means comprises intermediate voltage setting means operable at a first voltage and a second voltage different from the first voltage, having the same conductive type with the amplifying MOS transistor, and at a stand-by state, for setting the gate control voltage of the transfer gate means at a third voltage which is level shifted from the first voltage in an extent corresponding to a threshold voltage of the MOS transistor, and selection voltage setting means for setting the gate control voltage of the transfer gate means corresponding to the memory cell array of the selected side at the first voltage and setting the gate control voltage of the transfer gate means corresponding to the memory cell array of the non-selected side at the second voltage, upon selection of the memory cell arrays.

7 Claims, 6 Drawing Sheets

DYNAMIC RAM

BACKGROUND OF THE INVENTION

The present invention relates to a dynamic RAM. More specifically, the invention relates to a dynamic RAM employing a dual word line system including a word driver sequence and a sense amplifier sequence for respective of a plurality of separated blocks.

In general, a dynamic RAM includes a memory cell array for outputting holding data to a bit line when selected and sense amplifiers for amplifying the outputs. Typical construction of the dynamic RAM will be discussed with reference to FIGS. 4 and 5.

In FIG. 4, memory cells 10 and 14 are provided at both sides of a sense amplifier 12. Transfer gates TG are provided corresponding to respective memory cells. Each transfer gate TG has a function to block and establish electrical connection between the corresponding memory cell and the sense amplifier 12.

A construction, in which the transfer gate TG is arranged in distributing manner, is illustrated in FIG. 5. In FIG. 5, the cell arrays 10A, 10B, ... 10N and word driver sequences 11A, 11B, ... 11N are arranged alternately. The sense amplifier sequences 12A, 12B, ... 12N are provided corresponding to respective cell arrays. On each portion where the word driver sequence and the sense amplifier are intersect, a transfer data driver circuit (hereafter referred to as TG driver circuit) 13A, 13B, ... 13N are provided. For driving these TG driver circuits, a main TG driver circuit 130 is provided. It should be noted that a decoding output of a word decoder 110 is transmitted through a main word line MW for selecting desired word driver (e.g. the driver 111 shown by hatched portion) among the word driver sequences. By this, a sub-word line SW is activated to select desired one of the memory cell in the cell array.

When the memory cell is selected, the transfer gate corresponding to the selected cell must be placed at a state for establishing the electrical connection, and the transfer gate corresponding to the non-selected cell must be placed at a state for blocking electrical connection. Therefore, the main TG driver circuit 130 feeds a main transfer gate signal. By this, the TG driver circuit feeds a sub-transfer gate signal to selectively placing the transfer gate into the state for establishing or blocking electrical connection.

For example, when the word driver 111 is selected as shown, a main transfer gate signal MTG0 is output from the main TG driver circuit 130. Then, a sub-transfer gate signal STG00 is output from the TG driver circuit 13C. Then, the selected memory cell is connected to the sense amplifier. On the other hand, the non-selected memory cell provided at the opposite side (not shown) of the cell array 10C across the memory cell is electrically disconnected from the sense amplifier.

Namely, referring again to FIG. 4, the memory cells 10 and 14 are provided at both sides of the sense amplifier 12. The transfer gates TG corresponding to respective memory cells 12 are controlled by the sub-transfer gate (sub-TG) signal STG00, STG01. By the sub-TG signals STG00 and STG01, one of the memory cells 10 and 14 is electrically connected to the sense amplifier 12 and the other is electrically disconnected to the sense amplifier so that the selected memory cell is accessed.

Here, when the transfer gate TG is formed of nMOS transistor (hereafter referred to as nMOSTr), a high potential level of the control signal must be elevated potential VPP (higher than the power source voltage VCC) in order to completely transmit the high potential of the sense amplifier 12 to the memory cells. Therefore, in the dynamic RAM employing dual word line system, when the intersections of word driver sequences and sense amplifier sequences, the TG driver circuit is constructed as shown in FIG. 6.

Namely, the TG driver circuit 130 comprises a pMOS transistor (hereafter referred to as pMOSTr) Q15 for transmitting the elevated potential VPP and nMOSTr Q11 for transmitting a grounding potential GND (GND level). Then, When the main transfer gate (main TG) signal MTG0 is at the elevated potential VPP, nMOSTr Q11 turns ON. Then, the sub-TG signal STG00 becomes the GND level. On the other hand, when the signal MTG0 is GND level, nMOSTr Q11 turns ON. Then, the sub-TG signal STG00P becomes the elevated potential VPP. The TG driver circuit for outputting the TG signal STG01 comprises pMOSTr Q16 and nMOSTr Q12 in similar manner to the circuit 13C and is controlled by a main TG signal MTG1.

The operation of the TG driver circuit constructed as set forth above will be discussed with reference to FIG. 7. At the stand-by state, the transfer gate signals MTG0 and MTG1 are initially at GND level. At this time, the sub-TG signals STG00 and STG01 are both held at the elevated potential VPP. Namely, in FIG. 4, the memory cell side and the sense amplifier side of the bit line are connected (period ① in FIG. 7). When the sense amplifier is selected, the main TG signal of the selected side, e.g. MTG0 is held at the GND level, while the main TG signal, e.g. MTG1, of the non-selected side is risen to the VPP level (period ② of FIG. 7). Then, only the sub-TG signal STG01 of the non-selected side is lowered down to the GND level so that the memory cell side and the sense amplifier side of the bit line is electrically disconnected.

Upon termination of the operation of the sense amplifier, the main TG signal MTG1 of the non-selected side is lowered down to the GND level to rise the sub-TG signal STG01 to the VPP level. Thus, the both sides of the sense amplifier is connected to the memory cells to be placed into the stand-by state (period ③ of FIG. 7).

In the conventional dynamic RAM constructed as set forth above, since the TG driver circuit for separating the bit line between the memory cell side and the sense amplifier side upon the operation of the sense amplifier employs a circuit using the elevated potential VPP, semiconductor well has to be provided separately from the sense amplifier in the semiconductor substrate. This will be further discussed with reference to FIG. 8.

FIG. 8 is a section showing a semiconductor well structure of the conventional dynamic RAM. As set forth above, since TG driver circuit employs pMOSTr using VPP as power source, it becomes necessary to provide N-well 100 of VPP level. Also, nMOSTr forming the sense amplifier normally draw a substrate voltage to a negative voltage VSUB similarly to the memory cell transistor, P-wells 101 and 102 of VSUB become necessary. Furthermore, in order to separate the P-wells from the substrate, N-wells 103 and 104 of VCC level become necessary. In addition, since the N-well 100 of the TG driver circuit and N-wells 103 and 104 of the sense amplifier have different potential, P-wells 105 and 106 of the GND level become necessary. For the reason set forth above, the well structures of the TG driver circuit and the sense amplifier become as illustrated in FIG. 8.

It should be appreciated that 201 and 202 are N-wells of VCC level forming a peripheral circuit, and 203 and 204 are P-wells of GND level.

Accordingly, when the TG driver circuits are arranged in distributing manner, chip area is increased to cause rising of the cost therefor.

On the other hand, in the above-mentioned conventional dynamic RAM, since the sub-TG signals are held at the elevated potential even at the stand-by state, power consumption is relatively large.

SUMMARY OF THE INVENTION

The present invention is worked out for solving the drawbacks in the prior art. Therefore, it is an object of the present invention to provide a dynamic RAM which can make a chip area compact and reduce power consumption.

In order to accomplish the above-mentioned and other objects, a dynamic RAM, according to the present invention, comprises:

first and second memory cell arrays respectively outputting holding data to corresponding bit lines when selected;

sense amplifier means having amplifying MOS transistor for amplifying output of the bit lines of the first and second memory cell arrays;

first and second transfer gate means respectively providing corresponding to the first and second memory cell arrays and controlling establishing and blocking connection between corresponding memory cell array and the sense amplifier means;

first and second driver means respective provided corresponding to the first and second transfer gate means and generating gate control voltages for corresponding transfer gate means;

each of the first and second driver means comprising:

intermediate voltage setting means operable at a first voltage and a second voltage different from the first voltage, having the same conductive type with the amplifying MOS transistor, and at a stand-by state, for setting the gate control voltage of the transfer gate means at a third voltage which is level shifted from the first voltage in an extent corresponding to a threshold voltage of the MOS transistor; and selection voltage setting means for setting the gate control voltage of the transfer gate means corresponding to the memory cell array of the selected side at the first voltage and setting the gate control voltage of the transfer gate means corresponding to the memory cell array of the non-selected side at the second voltage, upon selection of the memory cell arrays.

BRIEF DESCRIPTION OF THE DRAWINGS

The present invention will be understood more fully from the detailed description given herebelow and from the accompanying drawings of the preferred embodiment of the invention, which, however, should not be taken to be limitative to the invention, but are for explanation and understanding only.

In the drawings.

DESCRIPTION OF THE PREFERRED EMBODIMENT

Next, an embodiment of a dynamic RAM according to the present invention will be discussed with reference to the drawings. In the following description, numerous specific details are set forth in order to provide a thorough understanding of the present invention. It will be obvious, however, to those skilled in the art that the present invention may be practiced without these specific details. In other instances, well-known structures are not shown in detail in order not to unnecessary obscure the present invention.

Figure 1:
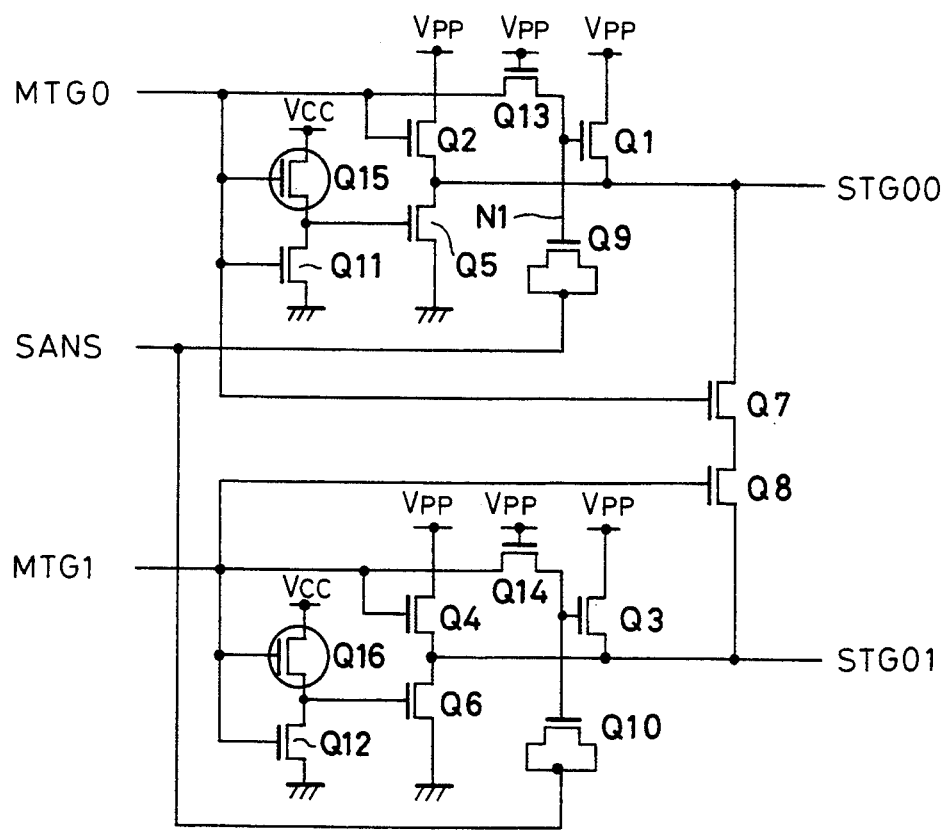
FIG. 1 is a circuit diagram of a TG driver circuit of one embodiment of a dynamic RAM according to the present invention.
Figure 6:
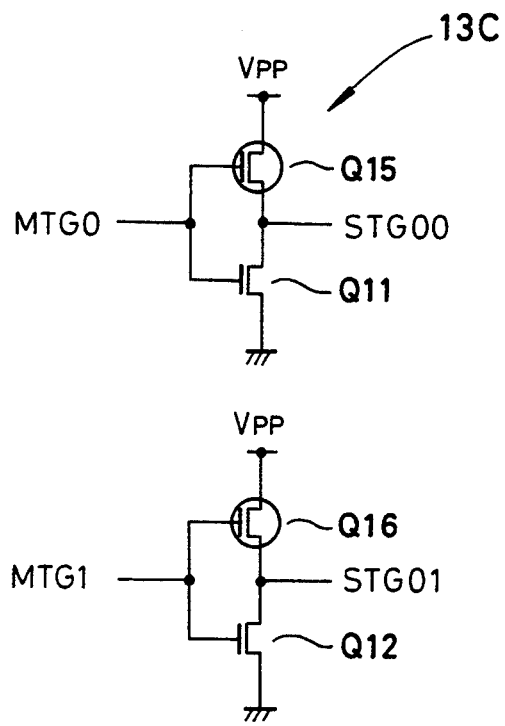
FIG. 6 is a circuit diagram of the TG driver circuit of the conventional dynamic RAM.
Figure 7:
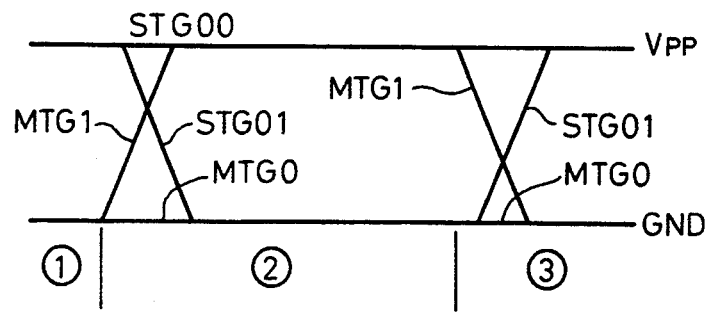
FIG. 7 is an operational waveform of the circuit of FIG. 6.

FIG. 1 is a circuit diagram showing the construction of a TG driver circuit of the currently preferred embodiment of the dynamic RAM according to the invention, in which like reference numerals to FIG. 6 show like elements. In FIG. 1, in the TG driver circuit in the shown embodiment of a dynamic RAM, all of the transistors except for transistors Q15 and Q16 are nMOSTr. This avoids necessity of providing P-wells of VPP level and thus contributes for reducing of the chip area in comparison with that in the prior art. Also, by setting the sub-TG signals STG00 and STG01 at lower voltage level than the elevated potential VPP, power consumption can be reduced.

Detailed discussion will be given hereinbelow for these features.

At first, the shown driver circuit is designed to provide the sub-TG signals STG00 and STG01 as gate control voltage depending upon the voltage levels of the main TG signals MTG0 and MTG1, to not shown transfer gates. Considering the circuit structure portion for outputting the sub-TG signal STG00 depending upon the voltage level of the main TG signal MTG0, the shown driver circuit comprises an inverter including pMOSTr Q15 and nMOSTr Q11, and nMOSTr's Q2 and Q5 for outputting a voltage level which is lower than the elevated voltage VPP in an extent of a threshold voltage VTN of the nMOSTr or GND level depending upon the inverter output and the main TG signal MTG0, as the sub-TG signal STG00.

On the other hand, the shown driver circuit further includes nMOSTr Q1 for outputting the elevated potential VPP as the sub-TG signal STG00 upon selection, and nMOSTr's Q9 and Q13 for boosting the junction N1 of the gate of the nMOSTr Q1 in response to an input of a sense amplifier power source activating signal SANS.

It should be appreciated that the circuit construction for outputting the sub-TG signal STG01 depending upon the voltage level of the main TG signal MTG1 is constructed in the similar manner with Tr's Q16 and Q12, Tr's Q4 and Q6 and Tr's Q3, Q10 and Q14. In addition, nMOSTr's Q7 and Q8 for performing switching operation to mutually shorting the transmission lines for the sub-TG signals upon resetting after selection, are provided.

The operation of the shown embodiment of the dynamic RAM constructed as set forth above will be discussed hereinbelow with reference FIG. 2.

At first, at the stand-by state, both of the main TG signals MTG0 and MTG1 are held at VPP level. By this, Tr's Q2 and Q4 are maintained at ON state. Therefore, the sub-TG signals STG00 and STG01 are set at the voltage level lower than the VPP level in the extent of the threshold voltage VTN (period ① of FIG. 2).

Figure 2:
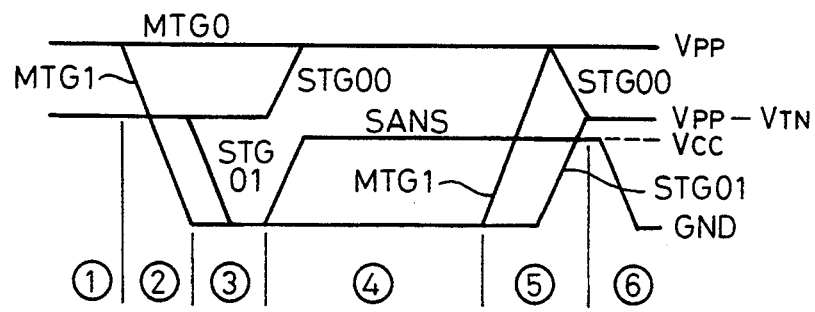
FIG. 2 is a waveforms showing operation of the circuit of FIG. 1.

Next, during memory cell selecting operation, the main TG signal of the selected side (here MTG0) is held at the VPP level, and the main TG signal MTG1 of the non-selected side is lowered down to the GND level (period ② of FIG. 2). Accordingly, the sub-TG signal STG00 Of the selected side maintains the level of VPP-VTN. On the other hand, the sub-TG signal STG01 of the non-selected side is lowered to the GND level by turning ON of Tr Q6 by the inverter output of the Tr's Q16 and Q12 (period ③ of FIG. 2).

Subsequently, the sense amplifier power source activating signal SANS is activated to be risen from the GND level to the VCC level of the internal power source voltage. By activation of the activating signal SANS, the junction N1 of the gate side of the Tr Q9 is boosted. Then, the sub-TG signal STG00 of the selected side is risen to the VPP level by turning of the Tr Q1 (period ④ of FIG. 2).

After termination of operation of the sense amplifier, reset operation is performed, in which the main TG signal MTG1 at the GND level is risen to the VPP level. By this, Tr Q4 turns ON to rise the sub-TG signal STG01 to the level of VPP-VTN. At this time, since both of Tr's Q7 and Q8 are held ON, the transmission lines for the sub-TG signals are mutually shorted. By this, the sub-TG signals STG00 and STG01 are varied to the level of VPP-VTN with balancing. Namely, the sub-TG signal STG01 at the GND level is risen to the VPP-VTN, and in conjunction therewith, the sub-TG signal STG00 at the VPP level is lowered down to the VPP-VTN (period ⑤ of FIG. 2).

Through the foregoing process, the stand-by state is re-established. Also, the activating signal SANS is lowered down to the GND level (period ⑥ of FIG. 2).

Figure 3:
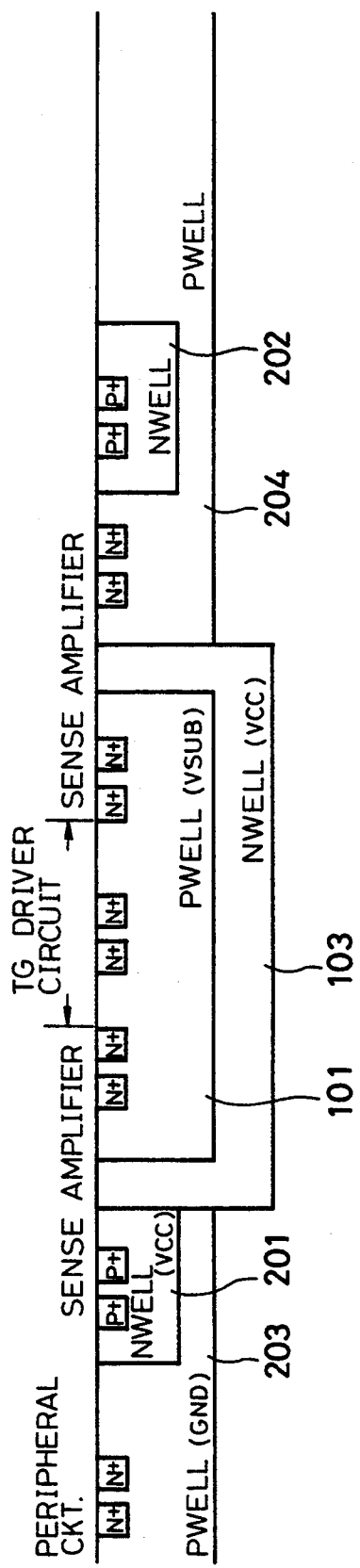
FIG. 3 is a section showing a well structure of the circuit of FIG. 1.
Figure 4:
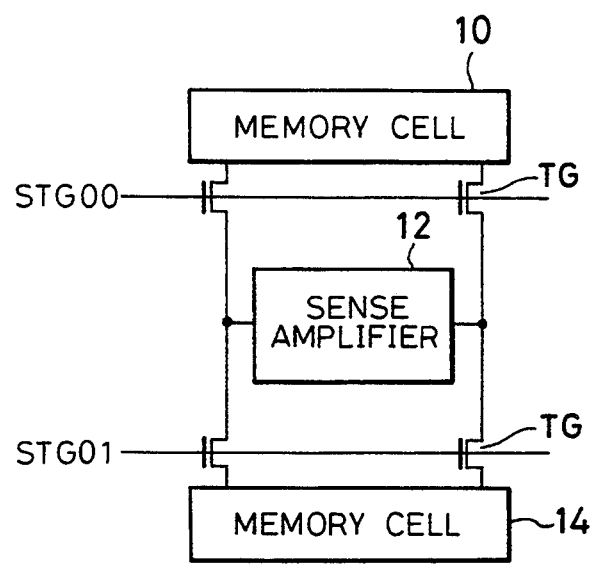
FIG. 4 is an illustration for discussion of a transfer gate to be employed in the dynamic RAM.
Figure 5:
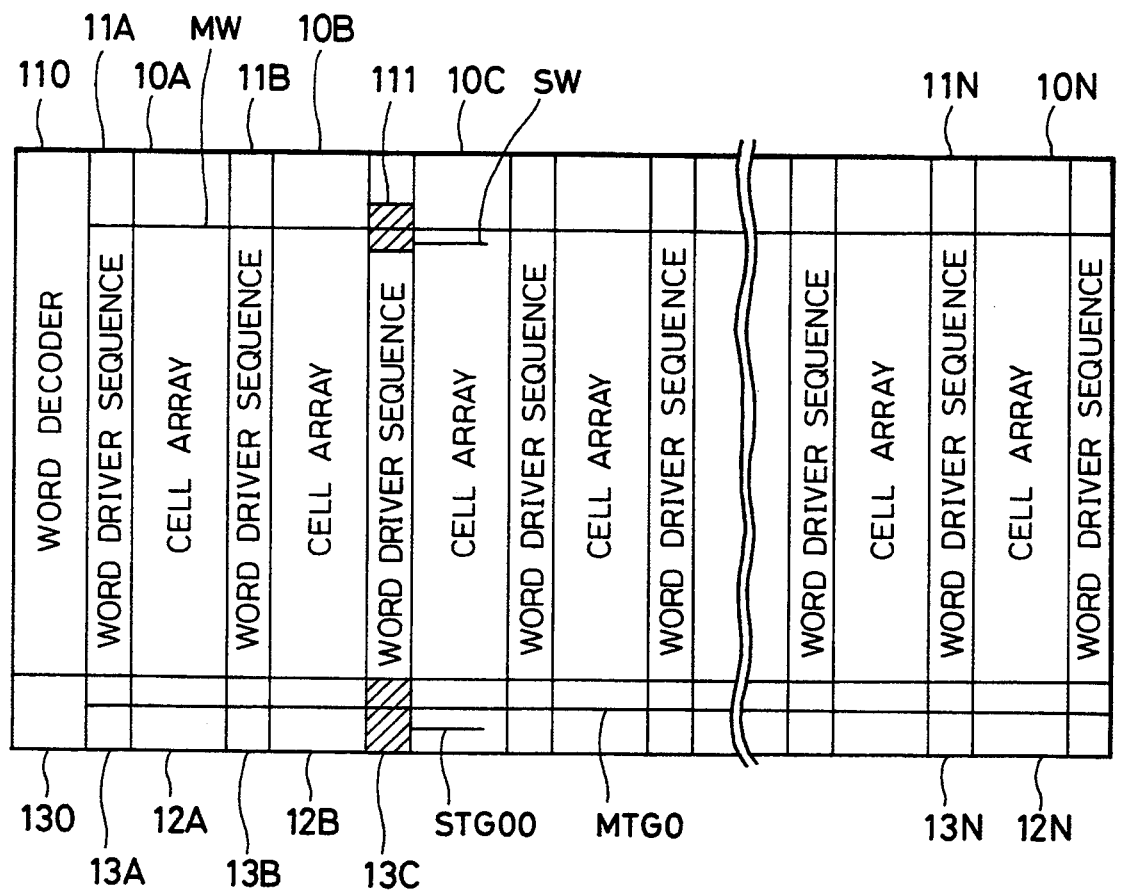
FIG. 5 is an illustration showing distributed arrangement of the transfer gate driver circuit of the dynamic RAM.
Figure 8:
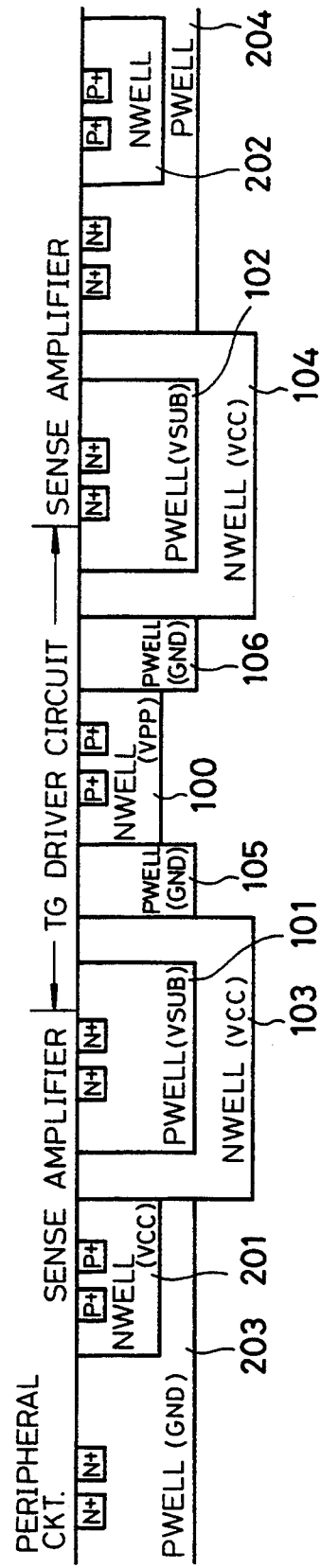
FIG. 8 is a section showing the well structure of the circuit of FIG. 6.

Next, discussion will be given for the well structure of the dynamic RAM having the TG driver circuit as shown in FIG. 1 with reference to FIG. 3. FIG. 3 is a section showing the well structure of the shown embodiment of the dynamic RAM. It should be noted that like reference numerals to FIG. 8 represent like elements.

In FIG. 3, since the shown embodiment of the TG driver circuit is formed with nMOSTr's which is the same conductive type to MOSTr's in the sense amplifier, they may be integrated in a common P-well 101.

Namely, different from the prior art, it is unnecessary to provide the P-wells of the VPP level, the TG driver circuit may use the P-well 101 common to the sense amplifier. Accordingly, although number of elements is increased in the shown embodiment of the TG driver circuit in comparison with the conventional circuit, in view of the area occupied by the wells for mutually separating the wells, the shown circuit may achieve reduction of the area.

On the other hand, in the shown embodiment of the circuit, the pMOSTr's Q15 and Q16 are employed for lowering the sub-TG signal to the GND level, the internal power source VCC is employed as the power source for these pMOSTr's. Since the N-well of the VCC level is present as that for the sense amplifier, the well can be used in common, no substantial increase of the area will be caused. It should be appreciated that, since the sense amplifier power source activating signal SANS which is already wired is used for rising the sub-TG signal of the selected side to VPP level, no additional wiring and circuit is required.

Returning to FIG. 2, in the shown embodiment of the driver circuit, the sub-TG signals STG00 and STG01 are set at the voltage level lower than the VPP level in the extent of VTN while not selected, the voltage level can be maintained lower than VPP level for VTN during stand-by state. Therefore, the power consumption can be reduced in the extent of VTN/VPP.

The present invention employs three potential system, which maintains the sub-TG signals STG00 and STG01 at VPP-VTN during stand-by state, rises to the elevated voltage VPP for the selected side and lowers to the GND level for the non-selected side upon selection of the memory cell, for achieving lowering of power consumption.

It should be noted that, as the prior art for this three potential system, Sinzo Sakuma, et al. "*A study of Shared-Sense-Amp Control Circuit for DRAM*", Paper, pp5≧248, in 1992, Spring Meeting of the Institute of Electronics, Information and Communication Engineers of Japan.

However, the MOSTr forming the TG driver circuit in this paper has CMOS structure employing the voltages of the elevated level VPP and the grounding level as operating power source. Accordingly, the integrated circuit construction of this example is similar to the conventional construction illustrated in FIG. 8, and thus requires P-well 100 for the VPP level and P-wells 105 and 106 for isolation of the grounding level to require a large area for the integrated circuit.

It should be noted that although the foregoing embodiment is discussed for the case where the TG driver circuit is constructed with nMOSTr's, similar effect can be expected in the case that the TG driver circuit is constructed with pMOSTr's in place of nMOSTr'so However, in such case, polarity of all power source voltages should be reversed, and P-wells should be replaced with N-wells and N-wells should be replaced with P-wells, in the construction of FIG. 3.

As set forth above, according to the present invention, by selecting MOSTr forming the TG driver circuit to have the same conductive type with the amplifying MOSTr of the sense amplifier, both can be integrated in common wells to reduce the area of the chip. Also, according to the present invention, since the gate control voltage of the TG in the stand-by state is set at a voltage lower than elevated potential in the extent of the threshold voltage of the MOSTr, power consumption can be reduced.

Although the invention has been illustrated and described with respect to exemplary embodiment thereof, it should be understood by those skilled in the art that the foregoing and various other changes, omissions and additions may be made therein and thereto, without departing from the spirit and scope of the present invention. Therefore, the present invention should not be understood as limited to the specific embodiment set out above but to include all possible embodiments which can be embodies within a scope encompassed and equivalents thereof with respect to the feature set out in the appended claims.

What is claimed is:

1. A dynamic RAM comprising:
   first and second memory cell arrays respectively outputting holding data to corresponding bit lines when selected;
   sense amplifier means having an amplifying MOS transistor for amplifying an output of the bit lines of said first and second memory cell arrays;
   first and second transfer gate means corresponding respectively, to said first and second memory cell arrays for controlling connection between a corresponding memory cell array and said sense amplifier means;
   first and second driver means corresponding, respectively, to said first and second transfer gate means for generating gate control voltages for corresponding transfer gate means;
   each of said first and second driver means comprising:
      intermediate voltage setting means, having the same conductive type as that of said amplifying MOS transistor, operable at a first voltage and a second voltage different from said first voltage, and in a stand-by state for setting said gate control voltage of its corresponding transfer gate means at a third voltage which is level shifted from said first voltage to an extent corresponding to a threshold voltage of said MOS transistor; and
      selection voltage setting means for setting said gate control voltage of the transfer gate means corresponding to the memory cell array of the selected side at said first voltage and setting said gate control voltage of the transfer gate means corresponding to the memory cell array of the non-selected side at said second voltage, upon selection of said memory cell arrays.

2. A dynamic RAM as set forth in claim 1, wherein said amplifying MOS transistor of said sense amplifier means and a MOS transistor of said intermediate voltage setting means are formed in a common well provided in a semiconductor substrate.

3. A dynamic RAM as set forth in claim 2, wherein said conductive type of said MOS transistor is n-channel type.

4. A dynamic RAM as set forth in claim 1, wherein said first voltage has a greater absolute value than an operating power source voltage of said sense amplifier.

5. A dynamic RAM as set forth in claim 1, wherein said selection voltage setting means sets said gate control voltage of the transfer gate means of the selected side to said first voltage in response to a signal for activating said sense amplifier.

6. A dynamic RAM as set forth in claim 4, which further comprises reset means for returning both of the gate control voltages for said transfer gate means of said selected side and non-selected side to said third voltage with establishing balance therebetween, upon resetting selection of said memory cell array.

7. A dynamic RAM as set forth in claim 4, wherein said reset means includes a switching element for shorting transmission lines of both gate control voltages in response to an external reset command.

* * * * *

UNITED STATES PATENT AND TRADEMARK OFFICE
CERTIFICATE OF CORRECTION

PATENT NO. : 5,400,291
DATED : March 21, 1995
INVENTOR(S) : Isao Naritake, et al It is certified that error appears in the above-indentified patent and that said Letters Patent is hereby corrected as shown below:

Col. 6, line 30  delete "$\geq$" insert -- - --;

Col. 6, line 46 delete "uMOSTr'so", insert -- uMOSTr's. --

Signed and Sealed this

Eighteenth Day of July, 1995

Attest:

BRUCE LEHMAN

*Attesting Officer*    *Commissioner of Patents and Trademarks*